United States Patent
Nishida

(10) Patent No.: US 8,994,323 B2
(45) Date of Patent: Mar. 31, 2015

(54) CHARGING CIRCUIT AND CONTROL METHOD THEREFOR

(75) Inventor: Junji Nishida, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 389 days.

(21) Appl. No.: 13/602,001

(22) Filed: Aug. 31, 2012

(65) Prior Publication Data

US 2013/0063078 A1    Mar. 14, 2013

(30) Foreign Application Priority Data

Sep. 8, 2011    (JP) .................................. 2011-196226

(51) Int. Cl.
- H02J 7/00    (2006.01)
- G01R 25/00    (2006.01)
- H03K 5/22    (2006.01)
- H03K 17/687    (2006.01)

(52) U.S. Cl.
CPC ................. *H02J 7/0034* (2013.01); *H03K 5/22* (2013.01); *G01R 25/00* (2013.01); *H03K 17/687* (2013.01)
USPC ........... 320/107; 320/108; 320/128; 320/134; 320/135; 320/136; 320/148; 320/149; 320/161; 320/162; 320/165; 327/3; 327/90; 327/603

(58) Field of Classification Search
CPC .......... H02J 7/00; H02J 7/0034; G01R 25/00; H03K 5/22; H03K 17/687
USPC ......... 320/107, 108, 128, 134, 136, 148, 149, 320/161, 162, 164, 165; 327/3, 90, 603
See application file for complete search history.

(56) References Cited

U.S. PATENT DOCUMENTS

| | | | |
|---|---|---|---|
| 5,811,895 A | * | 9/1998 | Suzuki et al. .................. 307/125 |
| 2003/0125900 A1 | * | 7/2003 | Orenstien et al. ............. 702/132 |
| 2007/0057655 A1 | | 3/2007 | Nishida |
| 2007/0085515 A1 | | 4/2007 | Nishida |
| 2007/0145922 A1 | * | 6/2007 | Ito et al. ........................ 318/300 |

(Continued)

FOREIGN PATENT DOCUMENTS

| | | |
|---|---|---|
| JP | 8-251818 | 9/1996 |
| JP | 2008-129481 | 6/2008 |
| JP | 2008-228416 | 9/2008 |

OTHER PUBLICATIONS

Pokryvailo et al., "Design and Testing of a 5MW Battery-Based Inductive Power Supply", IEEE Transactions on Plasma Science, vol. 26, No. 5, Oct. 1998, pp. 1444-1453.*

(Continued)

*Primary Examiner* — Phallaka Kik
(74) *Attorney, Agent, or Firm* — Cooper & Dunham LLP

(57) ABSTRACT

A charging circuit includes a power path control unit which switches a first switch connected between a system connection terminal and a battery connection terminal on while not charging, and switches the first switch on and a second switch connected between an external power supply input terminal and the system connection terminal on while charging so as to supply power to a system and charge a battery. A voltage difference between the external power supply input terminal and the battery connection terminal is detected, a current flowing between the external power supply input terminal and the system connection terminal is detected, and it is determined that an external power supply is disconnected based on the detection results of the voltage differences and the current.

11 Claims, 6 Drawing Sheets

(56) References Cited

U.S. PATENT DOCUMENTS

| | | |
|---|---|---|
| 2007/0176588 A1 | 8/2007 | Nishida |
| 2007/0216389 A1 | 9/2007 | Nishida |
| 2008/0061758 A1 | 3/2008 | Nishida |
| 2008/0074096 A1 | 3/2008 | Nishida |
| 2008/0116868 A1 | 5/2008 | Nishida |
| 2008/0116869 A1 | 5/2008 | Nishida |
| 2008/0174292 A1 | 7/2008 | Nishida |
| 2008/0203990 A1 | 8/2008 | Nishida |
| 2008/0315850 A1 | 12/2008 | Nishida |
| 2009/0066293 A1* | 3/2009 | Miyanaga et al. ............ 320/134 |
| 2009/0085540 A1 | 4/2009 | Nishida |
| 2009/0174384 A1 | 7/2009 | Michishita et al. |
| 2010/0134085 A1 | 6/2010 | Nishida |
| 2010/0156363 A1* | 6/2010 | Chiu ............................. 323/274 |
| 2010/0314945 A1* | 12/2010 | Yamazaki et al. .............. 307/80 |
| 2011/0312287 A1* | 12/2011 | Ramachandran et al. ...... 455/77 |
| 2012/0215468 A1* | 8/2012 | Geris et al. ...................... 702/61 |

OTHER PUBLICATIONS

Verschueren et al., "Assessment and Mitigation of Voltage Violations by Soloar Panels in a Residential Distribution Grid", IEEE, 2011, pp. 540-545.*

* cited by examiner

US 8,994,323 B2

CHARGING CIRCUIT AND CONTROL METHOD THEREFOR

CROSS-REFERENCE TO RELATED APPLICATIONS

This patent application is based on and claims priority pursuant to 35 U.S.C. §119 to Japanese Patent Application No. 2011-196226, filed on Sep. 8, 2011, in the Japanese Patent Office, the entire disclosure of which is hereby incorporated herein by reference.

BACKGROUND OF THE INVENTION

1. Field of the Invention

This invention relates to a charging circuit that includes a disconnection detection unit for an external power supply and a power path control unit to control the supply of power to a system load and a battery. More specifically, to a charging circuit that includes an external power supply disconnection detection circuit that operates reliably without erroneous detection even when an external input voltage drops due to overload of the system, and without generating a reverse current when the external input voltage is decreased, and to a method of controlling the charging circuit.

2. Description of the Related Art

A charging circuit and devices which include the charging circuit generally mount a reverse current prevention circuit. In a reverse current prevention circuit, as disclosed in JP-3329168-B2, a resistor is connected in series between a power supply input and a battery, and voltages at both ends of the series resistor are compared to detect a reverse current to perform a halt control (disconnection detection).

In a reverse current prevention circuit disclosed in JP-2008-228416-A, when it is detected that the charging current falls below a predetermined value, a switch for preventing a reverse current is turned on and off in a predetermined constant cycle using an oscillator. When it is detected that the input voltage is decreased when the switch for preventing the reverse current is off, it is determined that a reverse current has occurred and a halt control operation (disconnection detection) is performed.

However, in the invention disclosed in JP-3329168-B2, to detect the reverse current, it is necessary to employ a resistor connected in series. Accordingly, a power loss at the resistor is definitely generated. When a resistor having a low resistance is used, a comparator having high precision is required. Further, in a charging circuit having a power path control system, there may be no voltage drop across the resistor under no system load conditions. Accordingly, there is a possibility of erroneous detection when only the voltage drop across the resistor is detected.

In the invention disclosed in JP-2008-228416-A, the decrease in the input voltage at the detection cycle of the reverse current is compared with a predetermined voltage value so that it is determined that it is in the reverse current condition when the input voltage is lower than the predetermined voltage value. Accordingly, when an unstable power supply such as a solar cell is used as the power source of the input voltage, there is a possibility that the input voltage cannot be detected correctly.

BRIEF SUMMARY OF THE INVENTION

The present invention has been made in view of the above points, and provides a charging without using a resistor for detecting the reverse current and a control method therefor that can detect the reverse current reliably without erroneous detection even when an unstable power supply source such as a solar cell is used.

More specifically, the present invention provides a charging circuit includes a power path control unit which switches a first switch connected between a system connection terminal and a battery connection terminal on while non-charging operation, and switches the first switch on and a second switch connected between an external power supply input terminal and the system connection terminal on while performing charging operation so as to supply power to a system and charge a battery. A voltage difference between the external power supply input terminal and a battery connection terminal is detected, a current flowing between the external power supply input terminal and the system connection terminal is detected, and it is determined that an external power supply is disconnected based on the detection results of the voltage differences and the current.

BRIEF DESCRIPTION OF THE DRAWINGS

A more complete appreciation of the invention and many of the advantages thereof may be obtained as the same become better understood by reference to the following detailed description when considered in connection with the accompanying drawings, wherein.

DETAILED DESCRIPTION OF THE INVENTION

Embodiments of the present invention are described below with reference to the accompanying drawings.

[First Embodiment]

Figure 1:
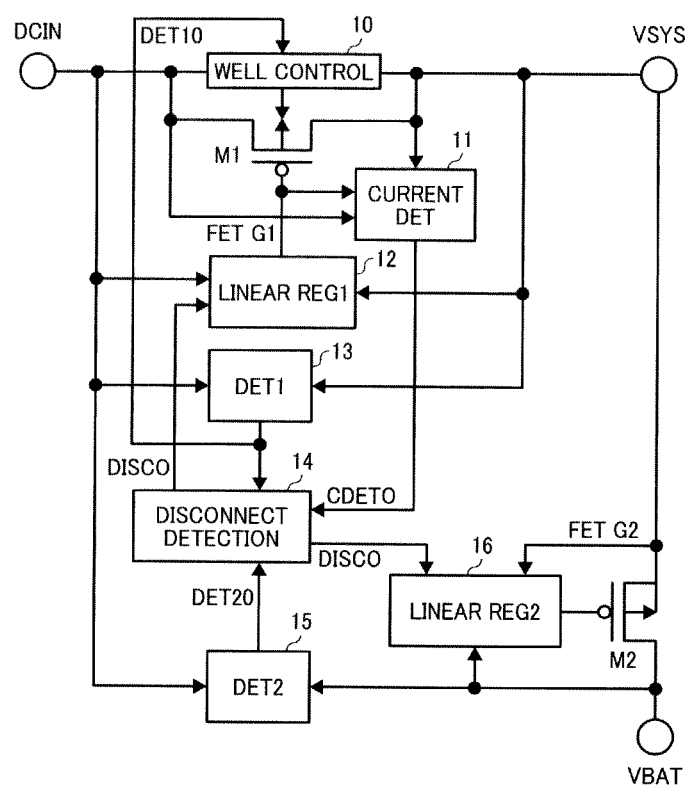
FIG. 1 is a block diagram of a first embodiment of a charging circuit according to the present invention.

FIG. 1 is a block diagram of an embodiment of a charging circuit according to the present invention. A Pch MOS transistor that is a switch is connected between an input terminal DCIN for external power supply (hereinafter referred to as the input terminal) and an output terminal VSYS for connecting a system (hereinafter referred to as the output terminal)., an output signal line of a first linear regulator 12 (LINEAR REG1 in FIG. 1) is connected to a gate of the transistor M1.

A well of the transistor M1 is connected to the input terminal DCIN or the output terminal VSYS by a well control circuit 10 (WELL CONTROL in FIG. 1). An output signal DET 10 from a voltage comparator 13 (DET 1 in FIG. 1) is input to the well control circuit 10 which is controlled by the output signal DET 10. Further, the output signal DET 10 from the voltage comparator 13 is input to an external power supply disconnection detection circuit 14 (DISCONNECT DETECTION in FIG. 1). The voltage comparator DET 1 13 is connected to the input terminal DCIN and the output terminal VSYS to compare voltages at the input terminal DCIN and the output terminal VSYS.

The reason the well potential of the MOS transistor is controlled is because the well potential of the P channel transistor is used also for the source potential of the transistor. In this configuration, since the external power supply is connected to the source, a reverse current is generated due to a parasitic diode of the P channel transistor even when the external power supply is disconnected. To prevent such a reverse current, a direction of the parasitic diode is changed by controlling the well potential.

A current detector 11 (CURRENT DET in FIG. 1) is connected to the input terminal DCIN and the output terminal VSYS to detect a current of the transistor M1, and it is set to detect when current through the transistor M1 is zero. A detection signal CDET0 of the current detector 11 is input to the external power supply disconnection detection circuit 14. The first linear regulator 12 monitors the current flowing to the input terminal DCIN and controls a signal FET G1 so that the output voltage VSYS is kept at a constant value.

A P channel MOS transistor (hereinafter referred to as a transistor) M2 is connected between the output terminal VSYS and the battery connection terminal VBAT to connect a battery (hereinafter referred to as a battery terminal). A gate of the transistor M2 is connected to an output signal line of a second linear regulator 16 (LINEAR REG2 in FIG. 1). The second linear regulator 16 monitors a current flowing between the output terminal VSYS and the battery terminal VBAT, and controls a signal FET G2 so that the output voltage VBAT is kept at a constant value.

The voltage comparator DET2 15 is connected to the input terminal DCIN and the battery terminal VBAT to compare the voltages at the input terminal DCIN and the battery terminal VBAT and output a detection signal DET20. The detection signal DET20 is input to the external power supply disconnection detection circuit 14. The external power supply disconnection detection circuit 14 outputs a disconnection detection signal DISCO based on the detection signals DET10, DET20 and CDET0, and the disconnection detection signal DISCO is input to each linear regulator 12, 16.

When the first linear regulator 12 is off, the transistor M1 connected between the input terminal DCIN and the output terminal VSYS is switched, and the second linear regulator 16 switches the transistor M2 connected between the output terminal VSYS and the battery terminal VBAT on. When the linear regulators 12 and 16 are on, the linear regulators 12 and 16 control the transistors M1 and M2, respectively, based on a predetermined voltage and a regulated current value.

The operation of the disconnection detection circuit is described below.

Figure 2:
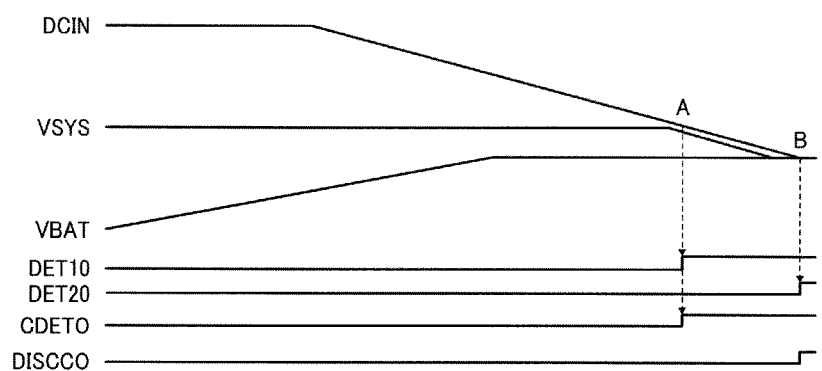
FIG. 2 shows signal waveforms when a detection signal is decreased when an external power supply is disconnected from an input terminal DCIN of the charging circuit shown in FIG. 1.

FIG. 2 shows signal waveforms when the detection signal is decreased when the external power supply, not shown, is disconnected from the input terminal DCIN of the charging circuit shown in FIG. 1. In FIG. 2, the horizontal axis shows time, and the vertical axis shows voltage.

When the voltage of the signal at the input terminal DCIN is decreased and falls below a preset voltage set in advance by the first linear regulator 12 (refer to FIG. 1), the voltage at the output terminal VSYS begins to decrease also (point A). When the voltage of at the input terminal DCIN and the voltage of the output terminal VSYS become almost equal, the voltage comparator which monitors the signal at the input terminal DCIN and the signal at the output terminal VSYS outputs a detection signal DET10.

Further, since the external power supply (not shown) is disconnected from the charging circuit shown in FIG. 1, there is no current supply from the transistor MI connected between the input terminal DCIN and the output terminal VSYS (refer to FIG. 1). and a signal CDET0 is output. When the voltage of the detection signal at the input terminal DCIN is decreased further to a potential almost equal to the voltage of the battery terminal VBAT, the voltage comparator which monitors the signal at the input terminal DCIN and the battery terminal VBAT outputs a detection signal DET20 (point B).

By receiving the detection signals DET10, DET20 and CDET0, the external power supply disconnection detection circuit 14 (refer to FIG. 1) determines that the external power supply (not shown) is disconnected.

Figure 3:
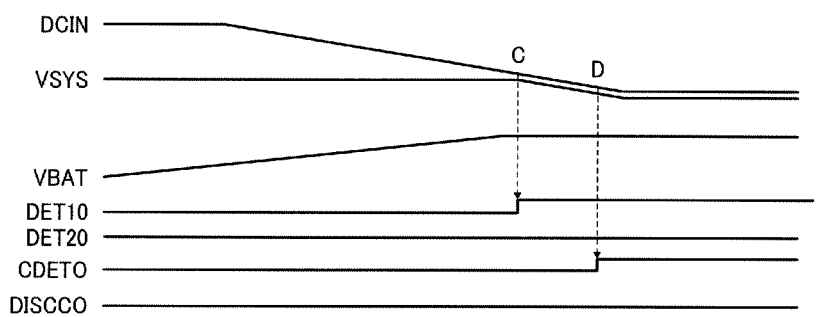
FIG. 3 is signal waveforms when a power supply such as a solar cell which outputs an unstable voltage (input voltage for a charging circuitry) is used as an external power supply.

FIG. 3 shows signal waveforms of when a power supply such as a solar cell which supplies an unstable voltage to the charging circuitry is used. Further, FIG. 3 shows a case in which the voltage of the signal at the input terminal DCIN is decreased below the voltage set in advance by the first linear regulator. In FIG. 3, the horizontal axis shows time, the vertical axis shows voltage.

When the power of the external power supply (output voltage) is varied, and falls below the preset voltage set in advance by the first linear regulator 12, the voltage at the output terminal VSYS is decreased in proportion to the voltage at the input terminal DCIN, and the voltage comparator 13 which monitors the voltages of the input terminal DCIN and the output terminal VSYS outputs a detection signal DET10 (point C).

When there is no charging current to the battery and no system load, the current detector 11 detects same and outputs signal CDET0 (point D). However, when the voltage of the input terminal DCIN is higher than the voltage at the battery terminal VBAT, the output signal DET20 of the voltage comparator 15 which compares the voltage at the input terminal for DCIN with the voltage at the battery terminal VBAT remains in the undetected state. Accordingly, the external power supply disconnection connection circuit 14 does not detect the disconnection. Thus, it is possible to detect the disconnection of the external power supply without fail even when the external power supply that supplies an unstable voltage such as a solar cell is used.

[Second Embodiment]

Figure 4:
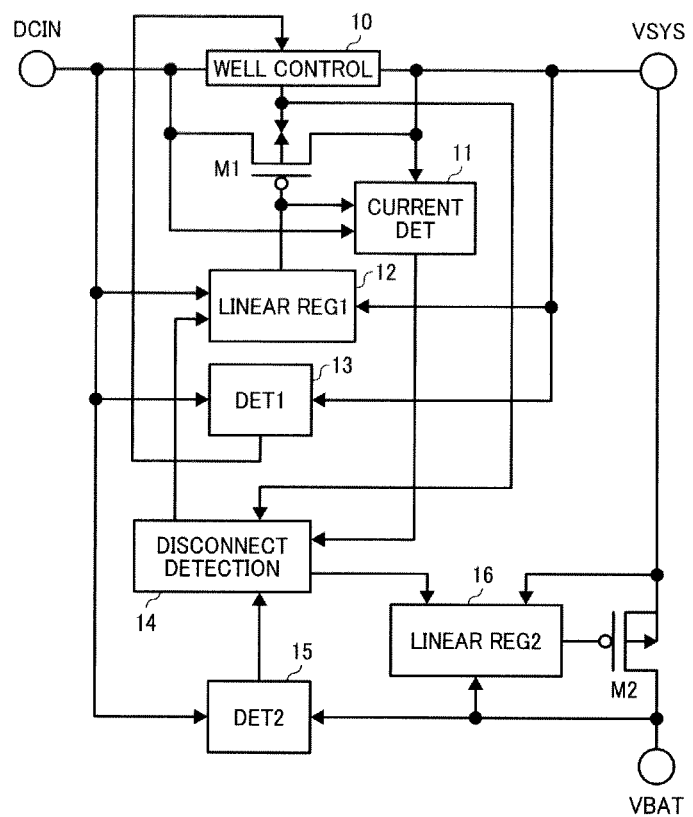
FIG. 4 is a block diagram of a second embodiment of a charging circuit according to the present invention.

FIG. 4 is a block diagram of a second embodiment of the charging circuit according to the present invention. The second embodiment shown in FIG. 4 is different from the first embodiment shown in FIG. 1 in that the charging circuit shown in FIG. 4 uses a control output signal from a well control circuit as the detection condition to determine the disconnection of the external power supply.

Accordingly, a direction of the parasitic diode (the direction of forward current) formed in the Pch transistor connected between the input terminal DCIN and the output terminal VSYS is from the input terminal (anode) toward the output terminal VSYS (cathode). Therefore. the current detector 11 detects only by the channel current of the Pch transistor M1, thereby, improving the detection accuracy of the current. Consequently, it is possible to detect the disconnection more reliably without erroneous detection.

[Third Embodiment]

Figure 5:
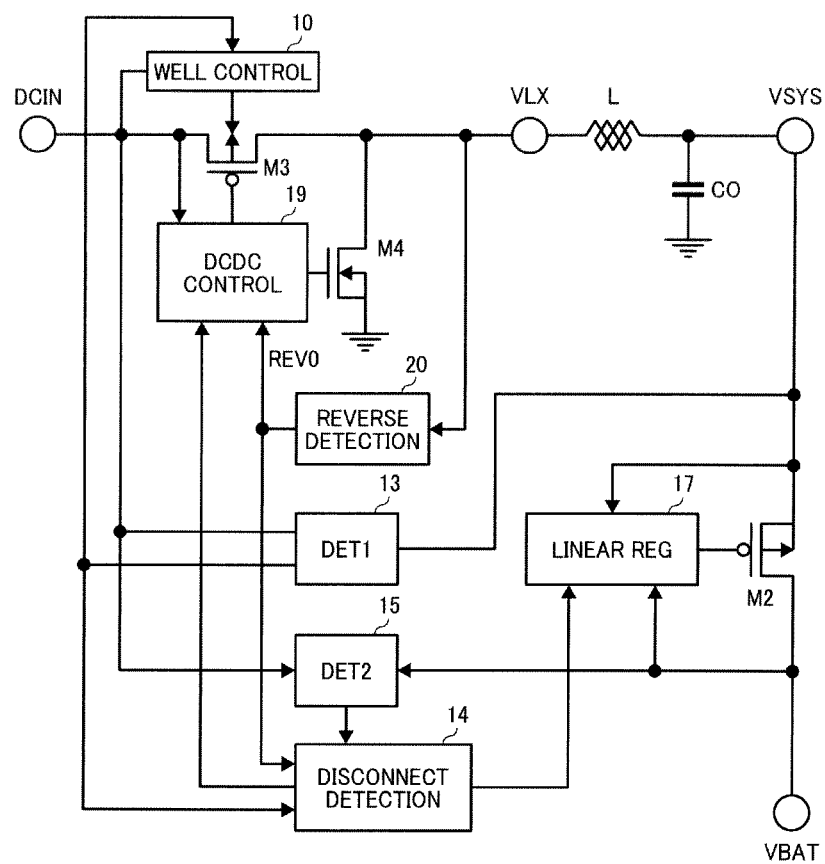
FIG. 5 is a block diagram of a third embodiment of a charging circuit according to the present invention in which a switching convertor is employed.

FIG. 5 is a block diagram of a third embodiment of the charging circuit according to the present invention in which a switching converter is used. The third embodiment shown in FIG. 5 is different from the first embodiment shown in FIG. 1 in that a switching power supply replaces the first linear regulator.

A Pch MOS transistor M3 (hereinafter referred to as transistor) is connected as a switch between the input terminal DCIN and the coil connection terminal VLX. An Nch MOS transistor M4 (hereinafter referred to as transistor) is connected between the coil connection terminal VLX and ground GND. A PWM (pulse width modulation) control signal is input from a DCDC controller 19 (DCDC CONTROL in FIG. 5) to the respective gates of the transistors M3 and M4.

The coil connection terminal VLX is connected to the reverse current prevention detection circuit 20 (REVERSE DETECTION in FIG. 5). When the coil current flows in reverse (the current flows in a direction from right to left in FIG. 5), the reverse current prevention detection circuit outputs a detection signal REV0. The detection signal REV0 is input to the DCDC controller 19 and the external power supply disconnection detection circuit 14. A coil L and an output capacitor C0 are connected between the coil connection terminal VLX and the output terminal VSYS. The other end of the capacitor C0 is connected to ground GND. Other connections are similar to the configuration of the embodiment shown in FIG. 1, and the detection operation of the disconnection of the external power supply is carried out by detecting the output signals DET10 and DET20 and the reverse current detection signal REV0 of the coil current. Accordingly, it is possible to perform the operation similar to that in the charging circuit which employs the linear regulator. Thus, it is possible to detect the disconnection of the external power supply without erroneous operation even when the external power such as a solar cell which supplies an unstable power is used.

[Fourth Embodiment]

Figure 6:
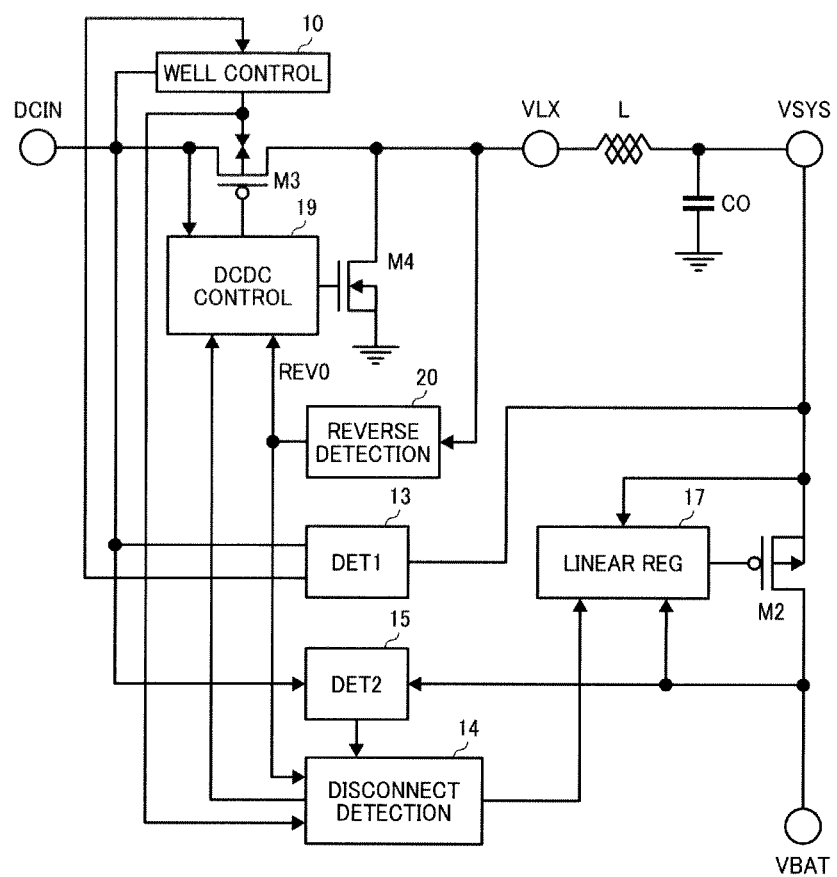
FIG. 6 is a block diagram of a fourth embodiment of a charging circuit according to the present invention.

FIG. 6 is a block diagram of a fourth embodiment of the charging circuit according to the present invention. The fourth embodiment shown in FIG. 6 is different from the first embodiment shown in FIG. 1 in that use of an output signal of the well control circuit is changed similarly to the second embodiment shown in FIG. 4. The disconnection detection is possible only when the direction of the parasitic diode (forward direction) of the P channel transistor connected between the input terminal DCIN and the output terminal VSYS is from the input terminal (anode) toward the output terminal VSYS (cathode).

[Fifth Embodiment]

Figure 7:
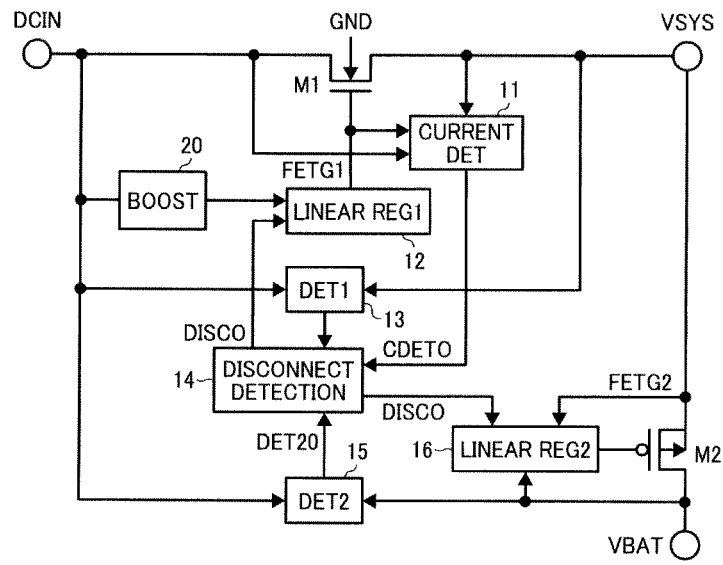
FIG. 7 is a block diagram of a fifth embodiment of a charging circuit according to the present invention.

FIG. 7 is a block diagram of a fifth embodiment of the charging circuit according to the present invention. The fifth embodiment shown in FIG. 7 is different from the first embodiment shown in FIG. 1 in that the transistor MI which is the first switch is an N channel FET. When the transistor MI is an N channel FET, a BOOST control is needed, and a well potential control is not needed, accordingly, the well control circuit is removed.

More specifically, a source of the transistor M1 whose well is connected to ground is connected to the input terminal DCIN, a drain of the transistor M1 is connected to the output terminal VSYS, and a gate of the of the transistor Ml is connected to the output terminal of the first linear regulator 12. The input terminal DCIN is connected to an input terminal of a Boost control circuit 20, an input terminal of a voltage comparator 13 and an input terminal of a voltage comparator 15. The output terminal of the Boost control circuit 20 is connected to an input terminal of the first linear regulator 12. The output terminal of the first linear regulator 12 is connected to the input terminal of the current detector 11 other than a gate of the transistor M1, further, the input terminal DCIN is connected to the input terminal of the current detector 11. The output terminal VSYS is connected to another input terminal of the current detector 11 and another input terminal of the voltage comparator 13. Further, the output terminal of the voltage comparator 13, the output terminal of the current detector 11 and the output terminal of the voltage comparator 15 are connected to the external power supply disconnection detection circuit 14.

An output terminal of the external power supply disconnection detection circuit 14 is connected to the input terminal of the first linear regulator 12 and input terminal of the second linear regulator 16. The output terminal VSYS and the battery terminal VBAT are connected to the input terminals of the second linear regulator 16. The output terminal of the second linear regulator 16 is connected to a gate of the transistor M2. A source of the transistor M2 is connected to the output terminal VSYS, a drain of the transistor M2 is connected to the battery terminal VBAT and input terminal of the voltage comparator 15. In this circuit, the similar effect to that in the circuit shown in FIG. 1 can be obtained.

[Sixth Embodiment]

Figure 8:
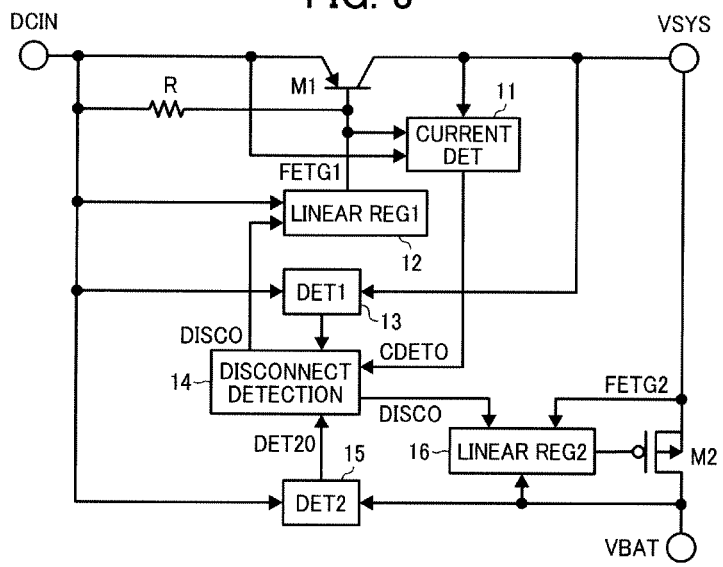
FIG. 8 is a block diagram of a sixth embodiment of a charging circuit according to the present invention.

FIG. 8 is a block diagram of a sixth embodiment of the charging circuit according to the present invention. The sixth embodiment shown in FIG. 8 is different from the first embodiment shown in FIG. 1 in that the transistor M1, that is the first switch, is a PNP type bipolar transistor. More specifically, the input terminal DCIN is connected to an emitter of the transistor M1, one end of a resistor R whose other end is connected to the base of the transistor M1, an input terminal of the first linear regulator 12, an input terminal of a voltage comparator 13, and an input terminal of a voltage comparator 15. The output terminal VSYS is connected to a collector of the transistor M1, an input terminal of the current detector 11, and an input terminal of voltage comparator 13. The output terminal of the first linear regulator 12 is connected to an input terminal of the current detector 11 other than the base of transistor M1. An input terminal of the current detector 11 is connected to the input terminal DCIN, and the output terminal of the current detector 11 is connected to an input terminal of the external power supply disconnection detection circuit 14. The output terminal of the voltage comparator 13 and the output terminal of the voltage comparator 15 are connected to input terminals of the external power supply disconnection detection circuit 14. The output terminal of the external power supply disconnection detection circuit 14 is connected to an input terminal of the first linear regulator 12 and an input terminal of the second linear regulator 16. The source and drain of the transistor M2 are connected to the output terminal VSYS and the battery terminal VBAT, respectively. The output terminal VSYS is connected to an input terminal of the second linear regulator 16, the battery terminal VBAT is connected to an input terminal of the second linear regulator 16 and an input terminal of voltage comparator 15, and an output terminal of the second linear regulator 16 is connected to a gate of the transistor M2. Further, a resistor R provides a bias voltage, and it is not for detecting a reverse current. In this circuit also, the similar effect to that in the circuit shown in FIG. 1 can be obtained.

The embodiments described above are examples only and the disclosure of this patent specification is not intended to be limited thereto. It is to be understood that each specific element includes all technical equivalents that operate in a similar manner and achieve a similar result. Numerous additional modifications and variations are possible in light of the above teachings. For example, in the embodiment shown in FIG. 8, the PNP type bipolar transistor is used to form the circuit, however, the present invention is not limited to this configuration, but an NPN type bipolar transistor may be used to form the circuit.

According to the embodiments, a linear control charging circuit includes an external power supply input terminal, a system connection terminal and a battery connection terminal and employs a power path control unit in which a switch connected between the external power supply input terminal and the system connection terminal is made on while non-charging operation, a switch connected between the external power supply input terminal and the system connection terminal is made on and a switch connected between the system connection terminal and the battery connection terminal is made on, while performing charging operation, to supply power to the system load and charge the battery, the charging circuit further includes a voltage comparator which detects the voltage difference between the external power supply input terminal and the system connection terminal, a voltage comparator which detects the voltage difference between the external power supply input terminal connection terminal and the battery connection terminal, a current detector which detects the current flowing between the external power supply input terminal and the system connection terminal. It is configured that the disconnection of the external power supply is detected based on the detection results of the voltage comparators and the current detector. Accordingly, a reverse current does not occur when an input external voltage is decreased and it is possible to detect the disconnection without erroneous detection even when the input voltage is dropped due to overload of the system, etc.

Further, according to the embodiments, it is determined that the external power supply is disconnected only when both voltage comparators detect equal input potentials and the current detector detects a zero current. Accordingly, a reverse current does not occur when an input external voltage of the external power supply is decreased and it is possible to detect the disconnection without erroneous detection even when the input voltage is dropped due to overload of the system, etc.

Further, according to the embodiments, both switches are formed of P channel FET, and the charging circuit includes a well control circuit which controls the potential of the Nwell of the P channel FET connected between the external power supply input terminal and the system connection terminal based on the detection result of the voltage comparator provided between the external power supply input terminal and the system connection terminal. Under a condition in which the well control circuit connects the potential of the Nwell to the potential of the system connection terminal, it is determined that the external power supply is disconnected only when the voltage comparator connected between the system connection terminal and the battery terminal detects equal input potentials and the current detector detects a zero current. Accordingly, it is possible to detect the disconnection without erroneous detection due to the reverse current flowing at the parasitic diode of the P channel FET.

Further, according to the embodiments, a switching control type charging circuit employs a power path control unit which includes an external power supply input terminal, a system connection terminal, a battery connection terminal, and a coil connection terminal, and while non-charging operation, a switch connected between the system connection terminal and the battery connection terminal is made on, and while performing charging operation, a switch connected between the external power supply input terminal and the coil connection terminal is caused to perform switching operation, the switch connected between the system connection terminal and the battery connection terminal is made on, so as to supply power to the system and charge the battery, the charging circuit further includes a voltage comparator which detects the voltage difference between the voltage at the external power supply input terminal and the voltage at the system connection terminal, a voltage comparator which detects the voltage difference between the voltage at the external power supply input terminal and the voltage at the battery connection terminal, and the reverse current detector which detects the reverse current of the coil, and it is determined that the external power supply is disconnected based on the detection results of the voltage comparators and the reverse current detector. Accordingly, a reverse current does not occur when the input external voltage is decreased, and it is possible to detect the disconnection without erroneous detection even when the input voltage is dropped due to overload of the system, etc.

Further, according to the embodiments, it is determined that the external power supply is disconnected only when the both voltage comparators detect equal input potentials and the reverse current detector detects a reverse current of the coil. Accordingly, the reverse current does not occur when an input voltage of the external power supply is decreased, and it is possible to detect the disconnection without erroneous detection even when the input voltage is dropped due to overload of the system, etc.

Further, according to the embodiments, the switch is formed of P channel FET, and the charging circuit includes a well control circuit which controls the potential of the Nwell of the P channel FET connected between the external power supply input terminal and the system connection terminal based on the detection result of the voltage comparator provided between the external power supply input terminal and the system connection terminal. Under a condition in which the well control circuit connects the potential of the Nwell to the potential of the system connection terminal, it is determined that the external power supply is disconnected only when the voltage comparator connected between the system connection terminal and the battery terminal detects equal potentials and the reverse current detector detects a reverse current of the coil. Accordingly, it is possible to detect the disconnection without erroneous detection due to the reverse current at the parasitic diode of the P channel FET.

Further, according to the embodiments, without using resistor, it is possible to detect the disconnection of the external power supply reliably without erroneous detection even when the power source of the input voltage is a solar cell.

What is claimed is:

1. A charging circuit comprising:
an external power supply input terminal;
a system connection terminal;
a battery connection terminal;
a first switch connected between the system connection terminal and the battery connection terminal;
a second switch connected between the external power supply input terminal and the system connection terminal;
a power path control unit configured to linearly control a power supply operation to supply power to a system and a charging operation to charge a battery by switching the first switch on while not charging, and switching the first and the second switches on while charging;
a first voltage comparator configured to detect a difference between a voltage at the external power supply input terminal and a voltage at the system connection terminal;
a second voltage comparator configured to detect a difference between the voltage at the external power supply input terminal and a voltage at the battery connection terminal;

a current detector configured to detect a current flowing between the external power supply input terminal and the system connection terminal; and an external power supply disconnection detection circuit configured to detect a disconnection of an external power supply based on detection results of the respective voltage comparators and detection result of the current detector.

2. The charging circuit according to claim 1, wherein the power path control unit determines that the external power supply is disconnected only when the voltage comparators detect equal input potentials, and the current detector detects a zero current.

3. The charging circuit according to claim 1, wherein the first and second switches comprise P channel FET, wherein the charging circuit further includes a well control circuit to control a potential of an Nwell of the P channel FET connected between the external power supply input terminal and the system connection terminal based on the detection result of the first voltage comparator provided between the external power supply input terminal and the system connection terminal, and wherein the external power supply disconnection detection circuit determines that the external power supply is disconnected only when the second voltage comparator connected between the external power supply input terminal and the battery connection terminal detects equal potentials and the current detector detects a zero current, under a condition in which the well control circuit controls the potential of the Nwell equal to the voltage at the system connection terminal.

4. The charging circuit according to claim 1, wherein the first switch comprises a P channel FET transistor and the second switch comprises an N channel FET, wherein the charging circuit further includes a boost control circuit to control the first switch based on a voltage at the external power supply input terminal, and wherein the external power supply disconnection detection circuit determines that the external power supply is disconnected only when the voltage comparator connected between the system connection terminal and the battery terminal detects equal potentials and the current detector detects a zero current.

5. The charging circuit according to claim 1, wherein the first switch comprises a bipolar transistor and the second switch comprises a P channel FET, and wherein the external power supply is input to an emitter of the bipolar transistor, and the external power supply disconnection detection circuit determines that the external power supply is disconnected only when the voltage comparator connected between the system connection terminal and the battery terminal detects equal potentials, and the current detector detects a zero current.

6. A charging circuit comprising:
an external power supply input terminal;
a system connection terminal;
a battery connection terminal;
a coil connection terminal;
a first switch connected between the system connection terminal and the battery connection terminal;
a second switch connected between the external power supply input terminal and the coil connection terminal;
a power path control unit configured to switch a power supply operation to supply power to a system and a charging operation to charge a battery, by switching the first switch on while not charging, and causing the second switch to perform switching operation and switching the first switch on while charging;

a first voltage comparator configured to detect a voltage difference between a voltage at the external power supply input terminal and a voltage at the system connection terminal;

a second voltage comparator configured to detect a voltage difference between a voltage at the external power supply input terminal and a voltage at the battery connection terminal;

a reverse current detector configured to detect a reverse current of the coil; and an external power supply disconnection detection circuit configured to determine a disconnection of an external power supply based on detection results of the voltage comparators and the detection result of the current detector.

7. The charging circuit according to claim 6, wherein the power path control unit determines that the external power supply is disconnected only when the voltage comparators detect equal potentials, respectively, and the reverse current detector detects a reverse current of the coil.

8. The charging circuit according to claim 6, wherein the first and second switches comprise P channel FET, wherein the charging circuit further includes a well control circuit to control the potential of an Nwell of the P channel FET connected between the external power supply input terminal and the system connection terminal based on the detection result of the voltage comparator provided between the external power supply input terminal and the system connection terminal, and wherein the external power supply disconnection detection circuit determines that the external power supply is disconnected only when the voltage comparator detects equal potentials and the reverse current detector detects a reverse current of the coil, under a condition in which the well control circuit controls the potential of the Nwell to be the voltage of the system connection terminal.

9. The charging circuit according to claim 6, wherein the first switch comprises an N channel FET transistor and the second switch comprises a P channel FET, wherein the charging circuit further includes a boost control circuit to control the first switch based on the voltage at the external power supply input terminal, and wherein the external power supply disconnection detection circuit determines that the external power supply is disconnected only when the voltage comparator connected between the system connection terminal and the battery terminal detects equal potentials and the reverse current detector detects a reverse current of the coil.

10. The charging circuit according to claim 6, wherein the first switch comprises a bipolar transistor and the second switch comprises a P channel FET, and wherein the external power supply is input to an emitter of the bipolar transistor, and the external power supply disconnection detection circuit determines that the external power supply is disconnected only when the voltage comparator connected between the system connection terminal and the battery terminal detects equal potentials and the reverse current detector detects a reverse current of the coil.

11. A method for controlling a charging circuit comprising the steps of:

switching a first switch connected between a system connection terminal and a battery connection terminal on while not charging;

switching the first switch and a second switch connected between an external power supply input terminal and a system connection terminal on while charging;
detecting a voltage difference between an external power supply input terminal and a system connection terminal;
detecting a voltage difference between the external power supply input terminal and a battery connection terminal;
detecting a current flowing between the external power supply input terminal and the system connection terminal; and
detecting the disconnection of an external power supply based on detection results of the voltage differences and the current.

* * * * *